United States Patent [19]
Rossi et al.

[11] Patent Number: 6,069,513
[45] Date of Patent: May 30, 2000

[54] TOGGLE FLIP-FLOP NETWORK WITH A REDUCED INTEGRATION AREA

[75] Inventors: Annamaria Rossi, Rho; Giona Fucili, Magenta; Marcello Leone, Rho; Maurizio Nessi, Como, all of Italy

[73] Assignee: STMicroelectronics S.r.l., Agrate Brianza, Italy

[21] Appl. No.: 09/141,709

[22] Filed: Aug. 28, 1998

[30] Foreign Application Priority Data

Aug. 29, 1997 [EP] European Pat. Off. .............. 97830432

[51] Int. Cl.⁷ .................................................. H03K 3/037
[52] U.S. Cl. ........................ 327/215; 327/216; 327/217
[58] Field of Search ................................. 327/215, 216, 327/217, 218, 202, 203; 326/52, 55, 57, 58

[56] References Cited

U.S. PATENT DOCUMENTS 3,755,692  8/1973  Mundy ..................................... 307/216
4,233,524  11/1980  Burdick ................................... 307/205
5,306,970  4/1994  Phillips .................................... 307/530
5,334,888  8/1994  Bodas ...................................... 307/471
5,923,185  7/1999  Zhou ........................................ 326/50
5,952,850  9/1999  Hojo et al. ................................ 326/83

FOREIGN PATENT DOCUMENTS

0249119 A1  12/1987  European Pat. Off. ........ H03K 19/21
0541840 A1  5/1993  European Pat. Off. ........ H03K 3/037

Primary Examiner—Toan Tran
Assistant Examiner—Quan Tra
Attorney, Agent, or Firm—Theodore E. Galanthay; David V. Carlson; Seed IP Law Group PLLC

[57] ABSTRACT

A toggle flip-flop with reduced integration area, comprising a flip-flop of the D-type with an inverting input stage and a master-slave portion. Three transistors connected to the inverting stage form a logic gate of the XOR type whereto the output terminal of the master-slave portion is fed back.

19 Claims, 4 Drawing Sheets

TOGGLE FLIP-FLOP NETWORK WITH A REDUCED INTEGRATION AREA

TECHNICAL FIELD

This invention relates to logic networks of the sequential type, and in particular to bistable circuits of the T-type, also referred to in the literature as toggle flip-flops (FFTs).

BACKGROUND OF THE INVENTION

Exemplary applications thereof include binary counters and synchronous frequency dividers. Considering binary counters, a one-bit counter has an input and n outputs which are the encoded form of the number of pulses that have been applied to the input from the initial time when the counter is reset. Therefore, the output states are 0, 1, 2, . . . , m, and 0, 1, 2, . . . , m. The n outputs allow $2^n$ different numbers to be encoded where $m<2^n-1$.

For a synchronous binary counter, the outputs are the numbers 0, 1 , . . . , $2^n-1$ expressed in the binary system. The transfer function is [C]=[C]+1 (mod $2^n$). This function has the following equations:

$y_0=y_0 XOR 1$ $y_i=y_i XOR\ y_{i-1} XOR\ y_{i-2} \ldots XOR$ with $y_0 i=1, 2, \ldots, n-1$, and where XOR is the exclusive OR logic operation.

These equations suggest using a toggle flip-flop cell. The toggle flip-flop changes over when T=1, otherwise the FFT cell would store the previous output value.

As shown in FIG. 1 of the drawings, and as well known to skilled persons in the art, a toggle flip-flop for use in monolithically integrated circuit devices generally comprises a flip-flop of the D-type (FFD) 2 and an XOR logic gate circuit 4. The XOR circuit has its output terminal connected to the input terminal of FFD and an input terminal connected to the output terminal of the flip-flop. The other input terminal is the T input of the resultant flip-flop of the T-type. Let D be the input data of FFD 2 and Q the output data, the equation at the input becomes:

D=(T) XOR (Q), which is of the same type as the equations for the binary counter.

The most commonly adopted constructions for a flip-flop of the T-type are as detailed herein below.

One construction provides standard logic gates 6, 8, 10 for the XOR input gate 4, and a cascade-connected flip-flop 2 of the D-type. This solution has an advantage in that it has good driving capability. But where NAND gates are used, for example, a large number of transistors (16=3 NANDs+2 NOTs) and complementary input signals (T, NT, Q, NQ) become necessary, as shown in FIG. 2 of the drawings.

A similar construction, retaining the valuable driving features of the former, may be implemented using a complex gate of the type shown in FIG. 3 for the XOR gate in order to use fewer transistors (10=complex gate) and avoid the need for complementary signals.

Using transfer gates as shown in FIG. 4 of the drawings may further reduce the number of transistors used (8=2 transfer gates+NOTs), but at the cost of a lower driving capability than that of the previous solutions, and requiring complementary input signals. The construction shown in FIG. 4 is preferred where savings in integration area are a condition.

SUMMARY OF THE INVENTION

An embodiment of this invention provides a toggle flip-flop which does not require any complementary input signals and has good driving capability, while requiring a significantly smaller number of transistors for implementing the XOR input gate.

A sequential logic network includes a D-type flip-flop that has a bistable output circuit and an input gate that transmits signals to the bistable output circuit. Timing signals applied to control terminals of the flip-flop control both the input gate and the bistable output circuit. The input gate has three electronic switches arranged such that two of the switches are connected in series between the input and output of the input gate, and the third switch is connected between a reference voltage and the output of the input gate. The first and third switches are controlled by the output of the bistable output circuit, while the second switch is controlled by one of the timing signals applied to the flip-flop. The features and advantages of a flip-flop of the T-type according to the invention can be appreciated from the following description of an embodiment thereof given by way of non-limitative example in relation to the accompanying drawings.

DETAILED DESCRIPTION OF THE INVENTION

Figure 1:
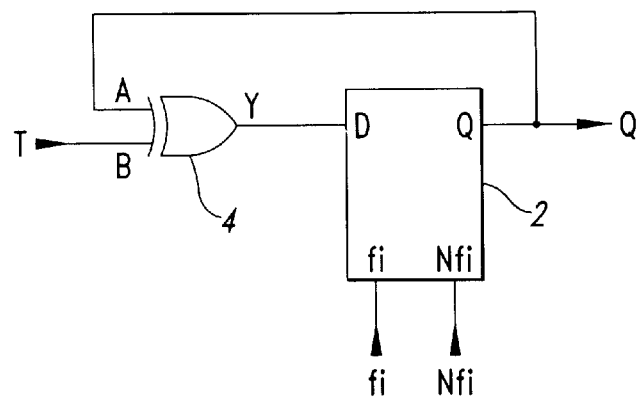
FIG. 1 is a schematic diagram of a flip-flop of the T-type as implemented by a flip-flop of the D-type and a XOR logic gate.
Figure 2:
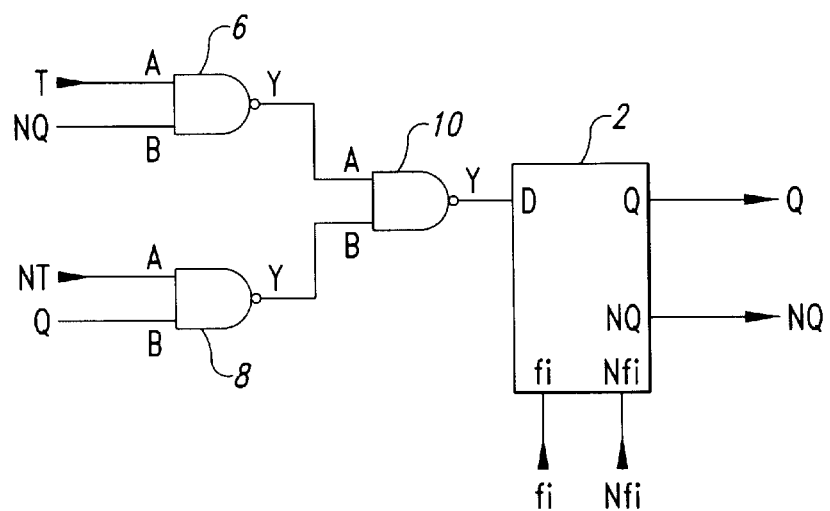
FIGS. 2, 3 and 4 show prior art embodiments of the XOR logic gate employed for a flip-flop of the T-type.
Figure 3:
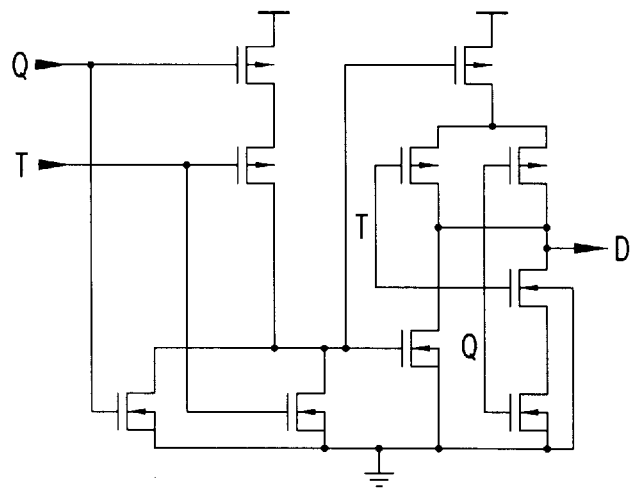
Figure 4:
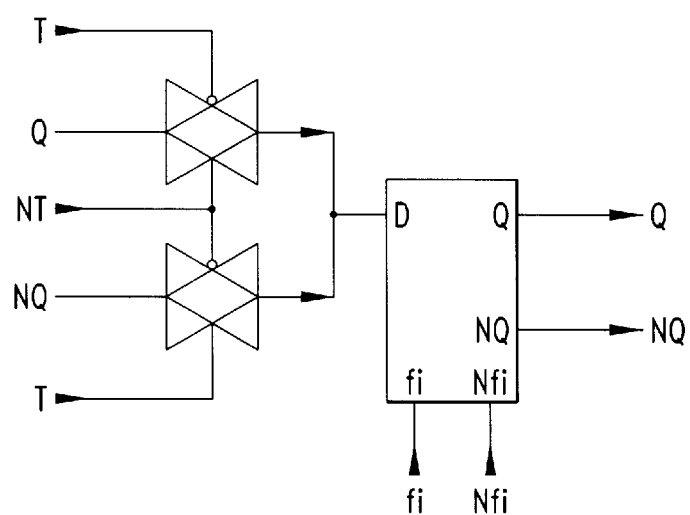
Figure 5:
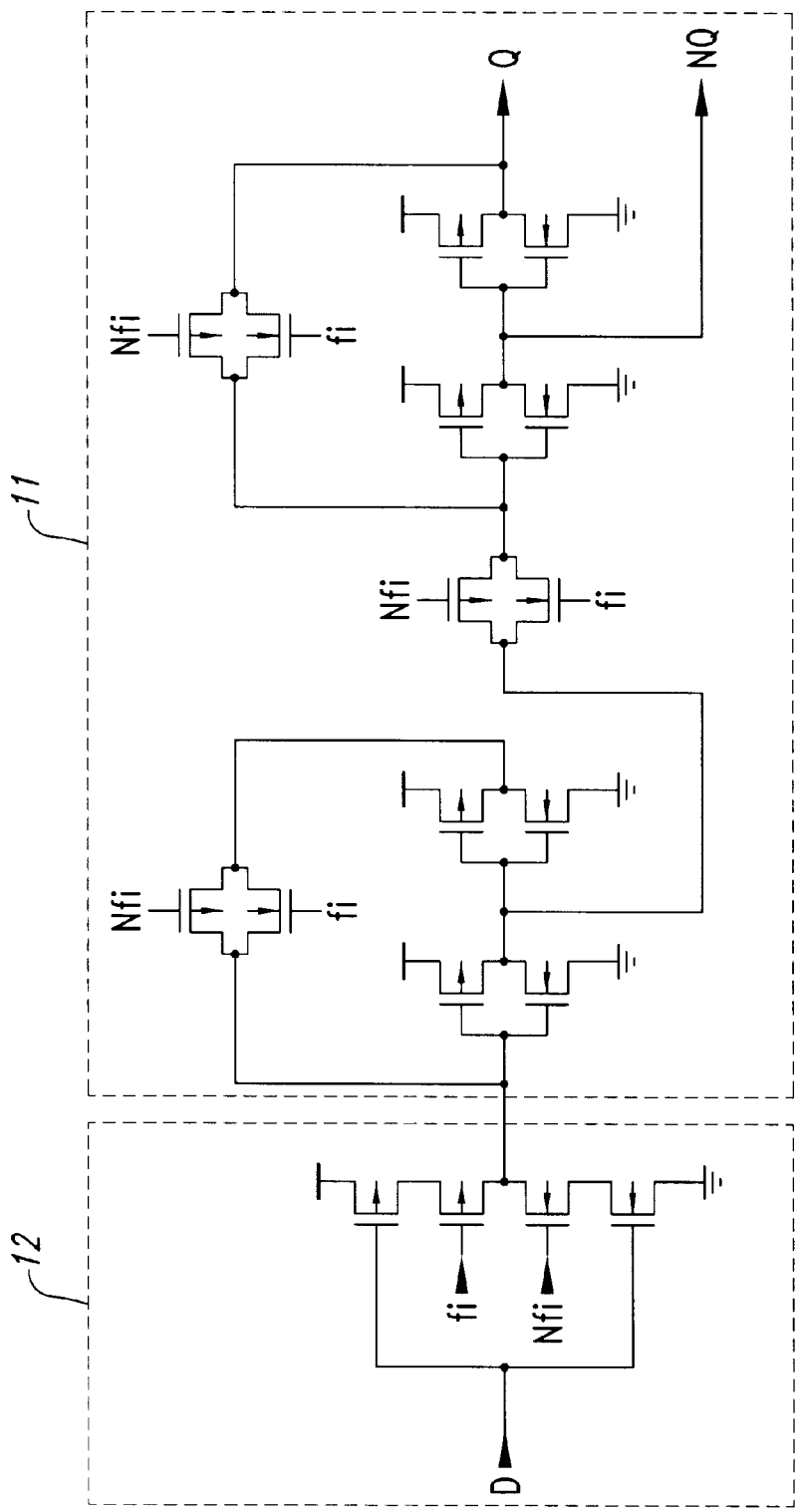
FIG. 5 shows a prior art embodiment of a flip-flop of the D-type having an inverting input stage.

Shown in FIG. 5 is a bistable output circuit 11 implemented by a flip-flop of the D-type, having a master-slave configuration and an input stage 12 of the inverting type to regenerate the signal applied to the input terminal D, as generally implemented in the state of the art by transistors of the complementary type. The master-slave configuration can be implemented in different circuit forms, but a tristate buffer with a high-impedance isolating and decoupling function is generally employed for the input stage.

According to an embodiment of the invention, a single input stage 14 is produced for the D-type flip-flop 11, thereby providing a novel toggle flip-flop (FFT) structure having the aforementioned features.

Figure 6:
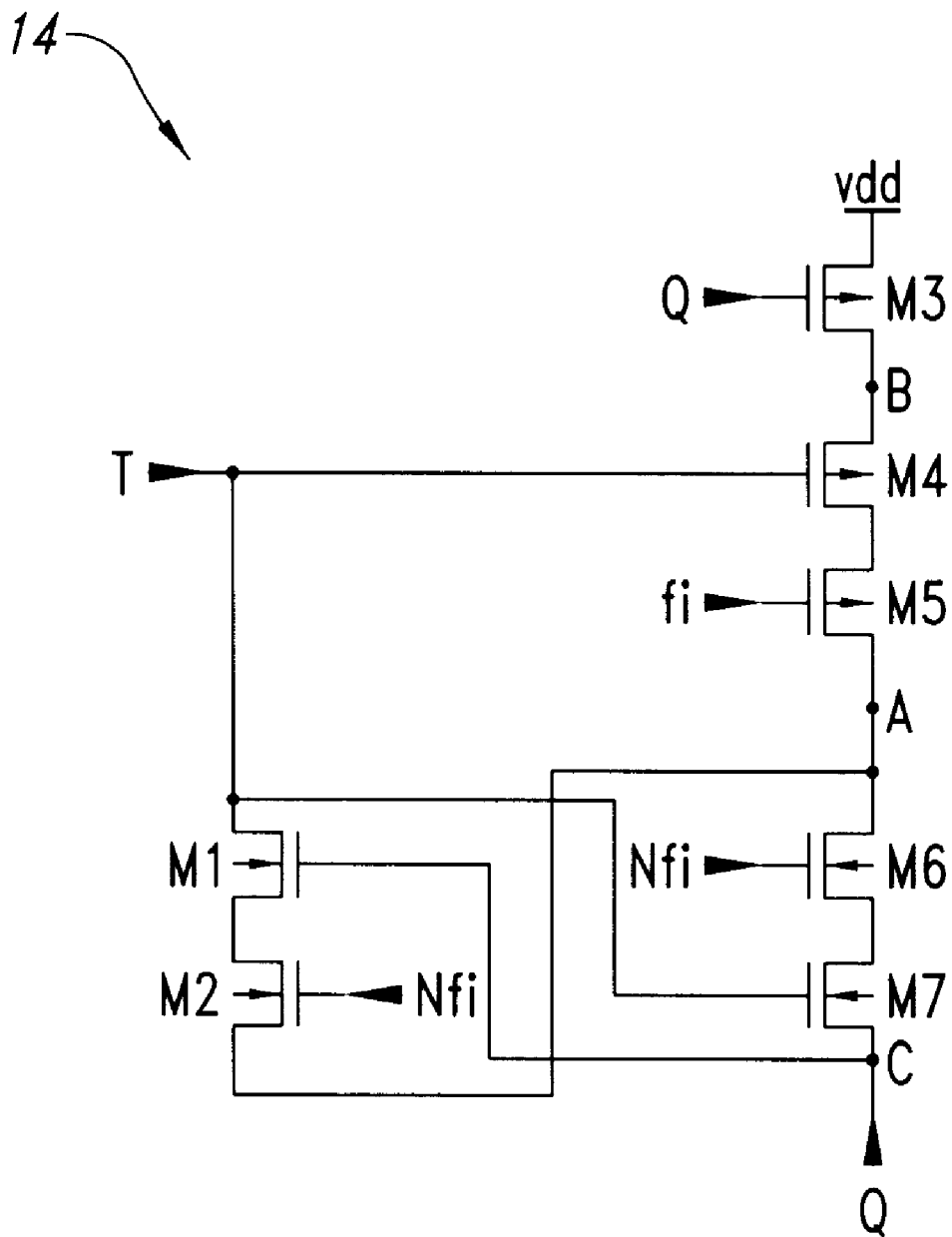
FIG. 6 shows the modified input stage that characterizes a flip-flop of the T-type according to the invention.

Assume a static master-slave FFD of the type shown in FIG. 5, having an inverting input stage 14 shown in FIG. 6. The novel flip-flop input stage 14 in FIG. 6 performs the XNOR function, that is, the equivalent function to the XOR gate plus the inverting input stage of the flip-flop. Compared to the previous constructions, the configuration shown in FIG. 6 has a smaller number of transistors, requires no complementary signals, and has good driving capability.

As shown in FIG. 6, only 3 transistors are used in addition to those in the standard inverting input stage 12 of FIG. 5, which stage is driven by standard timing signals fi and Nfi (with non-overlapping phases).

According to an embodiment of the invention, the novel XNOR input stage 14 comprises first and second transistors, $M_1$ and $M_2$, which are connected in series with each other, through respective source and drain terminals, between an input terminal T and an output circuit node A. A gate terminal of the first transistor $M_1$ is connected to a node C, while a gate terminal of the second transistor $M_2$ is applied the timing signal Nfi. A third transistor $M_3$ is connected between a circuit power supply line, Vdd, and a circuit node B. The output terminal of the flip-flop, corresponding to the output terminal Q of the D-type flip-flop shown in FIG. 5, is feedback connected to a gate terminal of the transistor $M_3$ and the circuit node C. In the embodiment shown in FIG. 6, the first and second transistors M1, M2 are N-channel MOS transistors and the third transistor M3 is a P-channel MOS transistor.

In FIG. 6, the feedback connections are only symbolically depicted for simplicity.

The input stage 14 also includes a fourth and fifth transistors M4, M5 series connected between the nodes B and A and sixth and seventh transistors M6, M7 series connected between the nodes A and C. The fourth and fifth transistor M4, M5 are P-channel transistors and the sixth and seventh transistors M6, M7 are N-channel transistors. The fourth and seventh transistors M4, M7 each have a gate terminal connected to the input terminal T. The fifth transistor M5 has a gate driven by the timing signal fi and the sixth transistor M6 has a gate driven by the timing signal Nfi.

Taking the input stage alone, the truth table that ties together the three inputs (Q, T, fi) and the output node A, is the following:

TABLE

| T | Q | fi | A |
|---|---|----|---|
| 0 | 0 | 0  | 1 |
| 0 | 0 | 1  | X |
| 0 | 1 | 0  | 0 |
| 0 | 1 | 1  | X |
| 1 | 0 | 0  | 0 |
| 1 | 0 | 1  | X |
| 1 | 1 | 0  | 1 |
| 1 | 1 | 1  | X |

The Table read as follows:
0=ground potential, GND;
1=vdd;
X=tristate condition;
fi=clock signal, Nfi being equivalent to negated fi.

The timing signals fi, Nfi are synchronized in a predetermined manner such that the FFT structure 14 operates in a toggle flip-flop mode. In conclusion, the performance of this flip-flop of the T-type is comparable to that of the previous ones, but is obtained with minimum are. Where a BCD or mixed technology is used, area optimization is a condition.

The above advantages are specially useful with counter implementations where n is large, the saving in area as n is increased being self-evident.

Modifications or substitutions may be made unto the embodiment described hereinabove, in manners known to those skilled in the art. In fact, the invention applicability need not be limited to an inverting input buffer, or to one of the tristate type.

From the forgoing it will be appreciated that, although specific embodiments of the invention have been described herein for purposes of illustration, various modifications may be made without deviating from the spirit and scope of the invention. Accordingly,the invention is not limited except as by the appended claims.

We claim:

1. A sequential logic network including a D-type flip-flop, having an input gate for transmitting signals to a bistable output circuit of the flip-flop, said input gate having first and second terminals, a signal input terminal which forms an input terminal of the network, and a signal output circuit node for connection to the bistable output circuit, and being controlled jointly with the bistable output circuit of the flip-flop by timing signals which are synchronized in a predetermined manner and applied to control terminals of the flip-flop, wherein the input gate comprises first, second, and third electronic switches, each having first, second and control terminals, the first and second switches being connected, in series with each other through their respective first and second terminals, between the input terminal of the input gate and the output node thereof, the third switch being connected, with its first and second terminals between the first terminal of the input gate and a network power supply line, and that the control terminals of the first and third switches and the second terminal of the input gate are connected to an output terminal of the flip-flop forming an output terminal of the network, timing signals synchronized in a predetermined manner being applied to the control terminal of the second switch.

2. The logic network according to claim 1 wherein the input gate for transmitting signals is a tristate interface circuit and the electronic switches are MOS transistors.

3. The logic network according to claim 2 wherein the third electronic switch is a transistor which is complementary to the transistors of the first and second electronic switches.

4. The logic network according to claim 3 wherein the timing signal synchronization is predetermined such that the network operates in the toggle flip-flop mode.

5. A binary counter device wherein it comprises at least one logic network according to claim 1.

6. A synchronous frequency divider device wherein it comprises at least one logic network according to claim 1.

7. A toggle flip-flop comprising:
    a bistable circuit having an input and an output; and
    an input circuit having an input and an output coupled to the input of the bistable circuit, the input circuit including:
        first and second switches series connected between the input and output of the input circuit, the first switch having a control terminal coupled to the output of the bistable circuit and the second switch having a control terminal coupled to receive a first timing signal; and
        a third switch having first, second, and control terminals, the first terminal being coupled to a reference voltage, the second terminal being coupled to the output of the input circuit, and the control terminal being coupled to the output of the bistable circuit.

8. The toggle flip-flop network according to claim 7 wherein the first, second, and third electronic switches each comprise a MOS transistor.

9. The toggle flip-flop network according to claim 8 wherein the first and second electronic switches each comprise NMOS transistors and the third electronic switch comprises a PMOS transistor.

10. The toggle flip-flop network according to claim 7 wherein the input circuit further comprises:
    first and second PMOS transistors coupled in series between the reference voltage and the output of the input circuit, a gate of the first PMOS transistor being coupled to the input of the input circuit, and a gate of the second PMOS transistor being coupled to receive a second timing signal; and
    first and second NMOS transistors coupled in series between the output of the input circuit and the output of the bistable circuit, a gate of the first NMOS transistor coupled to receive the first timing signal and a gate of the second NMOS transistor coupled to the input of the input circuit.

11. The toggle flip-flop network according to claim 10 wherein the second timing signal is the logical compliment of the first timing signal.

12. The toggle flip-flop according to claim 7 wherein the input circuit further includes a fourth switch having a control terminal coupled to the input of the input circuit, and being coupled between the second terminal of the third switch and the output of the input circuit.

13. The toggle flip-flop according to claim 7 wherein the input circuit further includes a fourth switch having a control terminal coupled to receive a second timing signal, and being coupled between the second terminal of the third switch and the output of the input circuit.

14. The toggle flip-flop according to claim 7 wherein the input circuit further includes a fourth switch having a control terminal coupled to receive the first timing signal, and being coupled between the output of the input circuit and the output of the bistable circuit.

15. The toggle flip-flop according to claim 7 wherein the input circuit further includes a fourth switch having a control terminal coupled to the input of the input circuit, and being coupled between the output of the input circuit and the output of the bistable circuit.

16. The toggle flip-flop according to claim 7 wherein the input circuit further includes fourth and fifth switches series connected between the second terminal of the third switch and the output of the input circuit, the fourth switch having a control terminal coupled to the input of the input circuit and the fifth switch having a control terminal coupled to receive a second timing signal.

17. The toggle flip-flop according to claim 7 wherein the input circuit further includes fourth and fifth switches series connected between the output of the input circuit and the output of the bistable circuit, the fourth switch having a control terminal coupled to receive the first timing signal and the fifth switch having a control terminal coupled to the input of the input circuit.

18. A method of controlling a bistable circuit having an input and an output, the method comprising:

providing a logic value, not equal to a logic value of a signal input, to the input of the bistable circuit in response to a first logic value from a timing signal and a first logic value from the output of the bistable circuit; and providing a logic value, equal to the logic value of the signal input, to the input of the bistable circuit in response to the first logic value from the timing signal and a second logic value from the output of the bistable circuit.

19. The method according to claim 18 wherein the step of providing a logic value, not equal to a logic value of a signal input, to the input of the bistable circuit includes switching a power supply line into electrical connection with the input of the bistable circuit when the signal input has a low logic value.

* * * * *